US007863627B2

(12) United States Patent
Honda

(10) Patent No.: US 7,863,627 B2
(45) Date of Patent: Jan. 4, 2011

(54) DISPLAY DEVICE AND ELECTRONIC DEVICE PROVIDED WITH THE SAME

(75) Inventor: Tatsuya Honda, Kanagawa (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 69 days.

(21) Appl. No.: 12/342,571

(22) Filed: Dec. 23, 2008

(65) Prior Publication Data

US 2009/0166638 A1 Jul. 2, 2009

(30) Foreign Application Priority Data

Dec. 27, 2007 (JP) ............................ 2007-336322

(51) Int. Cl.
*H01L 33/00* (2010.01)

(52) U.S. Cl. .................... 257/83; 345/76; 257/E33.001

(58) Field of Classification Search .................. 257/69, 257/71, 72, 83, E25.028, E33.001, E51.018; 345/76, 82

See application file for complete search history.

(56) References Cited

U.S. PATENT DOCUMENTS 5,287,205 A 2/1994 Yamazaki et al.
6,583,775 B1 6/2003 Sekiya et al.
6,713,783 B1 3/2004 Mase et al.
7,462,897 B2 * 12/2008 Endo .......................... 257/291
2004/0061671 A1 4/2004 Kawasaki et al.

FOREIGN PATENT DOCUMENTS

JP 2001-060076 3/2001
JP 2004-118132 4/2004
JP 2006-285267 10/2006

* cited by examiner

*Primary Examiner*—Quoc D Hoang
(74) *Attorney, Agent, or Firm*—Nixon Peabody LLP; Jeffrey L. Costellia

(57) ABSTRACT

An object is to suppress decrease in luminance and appearance of flicker of a still image and to control a threshold voltage of a transistor for driving an EL element even in a state where the EL element continues to emit light for a certain period. An n-channel transistor and a p-channel transistor are provided as driving transistors for driving a light-emitting element, and a polarity of a potential which is supplied from a data line is reversed every given period and supplied to gates of the driving transistors in each pixel, whereby the threshold voltages of the driving transistors are controlled and change of luminance of the light-emitting element due to the threshold voltage shifts of the driving transistors can be reduced.

11 Claims, 10 Drawing Sheets

DISPLAY DEVICE AND ELECTRONIC DEVICE PROVIDED WITH THE SAME

BACKGROUND OF THE INVENTION

1. Field of the Invention

The present invention relates to a display device, in particular, a display device provided with a light-emitting element as a display element. In addition, the present invention also relates to an electronic device provided with the display device in a display portion.

2. Description of the Related Art

In recent years, a technique for forming a thin film transistor (hereinafter referred to as a TFT) over a substrate has drastically progressed and technological development for applying a TFT to an active matrix display device has been advanced. In an active matrix display device, image expression properties with high definition and high gray scale levels have been demanded, and technology for high quality image has been actively developed. In particular, an electroluminescence element (hereinafter, an EL element) that is a light-emitting element shows promise for a display device provided for each of pixels in an active matrix display device in achieving high image quality, because it has a wider view angle than a liquid crystal display device using a liquid crystal element and superiority in color, contrast, and moving-image response speed. Thus, a display device provided with an EL element has been actively developed, and commercialization thereof has been advanced.

However, a transistor for driving an EL element is degraded in proportional to displaying time, and a difference occurs between a gray-scale level attempted to be displayed and a gray-scale level displayed in practice. This is because electrons and holes, which are carries, are trapped in a defect at an interface between a gate insulating film and a semiconductor layer, and space charge is generated at the interface; thus the threshold voltage of the transistor is shifted.

In order to solve the problem of shifting the threshold voltage of the transistor, it is effective to reverse the polarity of potential which is applied to a gate electrode of the transistor when an EL element emits light, and to apply the potential and the revered potential to the gate electrode alternately. For example, in order to control the threshold voltage of a transistor, Reference 1 (Japanese Published Patent Application No. 2004-118132) proposes a DC current drive display device in which the threshold control voltage with reverse polarity for controlling the threshold voltage is applied to a transistor during a threshold voltage control period being provided separately from a period during which an EL element as a light-emitting element is emitting light.

SUMMARY OF THE INVENTION

In the display device described in Reference 1, the threshold voltage of the transistor for driving the EL element can be controlled. However, in order to control the threshold voltage, a threshold voltage control period is provided separately from a pixel lighting period. That is, in a still image which is displayed by pixels provided with light-emitting elements continuing to emit light for a certain period of time, the pixel lighting period and the threshold voltage control period are repeated alternately. Thus, problems of decrease in luminance and appearance of flicker of the still image become more remarkable.

In view of such problems, it is an object of the present invention to control the threshold voltage of a transistor driving the EL element without decrease in luminance and appearance of flicker of a still image even in a state where an EL element continues to emit light for a certain period of time.

In the present invention, as a transistor for driving a light-emitting element, an n-channel transistor and a p-channel transistor are used, and a polarity of an image signal supplied from a data line is reversed for each a given period of time and the image signal whose polarity is reversed is supplied to each of pixels, whereby control of the threshold voltage of the transistor and retention of a light-emitting of the light-emitting element are concurrently realized.

An aspect of the present invention is a display device including an n-channel transistor including a first terminal which is electrically connected to a power supply line and a second terminal which is electrically connected to a light-emitting element, a p-channel transistor including a first terminal which is electrically connected to the power supply line and a second terminal which is electrically connected to the light-emitting element, and a switching element including a first terminal which is electrically connected to a data line and a second terminal which is electrically connected to a gate of the n-channel transistor and a gate of the p-channel transistor Another aspect of the present invention is a display device including an n-channel transistor including a first terminal which is electrically connected to a power supply line and a second terminal which is electrically connected to a light-emitting element, a p-channel transistor including a first terminal which is electrically connected to the power supply line and a second terminal which is electrically connected to the light-emitting element, a capacitor element including a first terminal which is electrically connected to a gate of the n-channel transistor and a gate of the p-channel transistor and a second terminal which is electrically connected to the power supply line, and a switching element including a first terminal which is electrically connected to a data line and a second terminal which is electrically connected to the gate of the n-channel transistor and the gate of the p-channel transistor Another aspect of the present invention is a display device including an n-channel transistor including a first terminal which is electrically connected to a first power supply line and a second terminal which is electrically connected to a light-emitting element, a p-channel transistor including a first terminal which is electrically connected to the first power supply line and a second terminal which is electrically connected to the light-emitting element, a first switching element including a first terminal which is electrically connected to a data line and a second terminal which is electrically connected to a gate of the n-channel transistor and a gate of the p-channel transistor, and a second switching element including a first terminal which is connected to a second power supply line and a second terminal which is electrically connected to the gate of the n-channel transistor and the gate of the p-channel transistor.

Another aspect of the present invention is a display device including an n-channel transistor including a first terminal which is electrically connected to a first power supply line and a second terminal which is electrically connected to a light-emitting element, a p-channel transistor including a first terminal which is electrically connected to the first power supply line and a second terminal which is electrically connected to the light-emitting element, a capacitorelement including a first terminal which is electrically connected to a gate of the n-channel transistor and a gate of the p-channel transistor and a second terminal which is electrically connected to the first power supply line, a first switching element including a first terminal which is electrically connected to a data line and a second terminal which is electrically connected to the gate of the n-channel transistor and the gate of the p-channel transistor, and a second switching terminal including a first terminal which is electrically connected to a second power supply line and a second terminal which is electrically connected to the gate of the n-channel transistor and the gate of the p-channel transistor.

In accordance with the present invention, the threshold voltage can be controlled without decrease in luminance and appearance of flicker of a still image even when an EL element continues to emit light for a certain period of time, by reversing the polarity of potential applied to a gate of a transistor driving the EL element and applying the potential and its reversed potential to the gate alternately.

DETAILED DESCRIPTION OF THE INVENTION

Embodiment modes of the present invention will be described below with reference to the drawings. However, it is easily understood by those skilled in the art that the present invention can be implemented in various different modes, and modes and details of the present invention can be modified in various ways without departing from the purpose and the scope of the present invention. Therefore, the present invention is not to be construed with limitation to what is described in the embodiment modes.

Embodiment Mode 1

Figure 1:
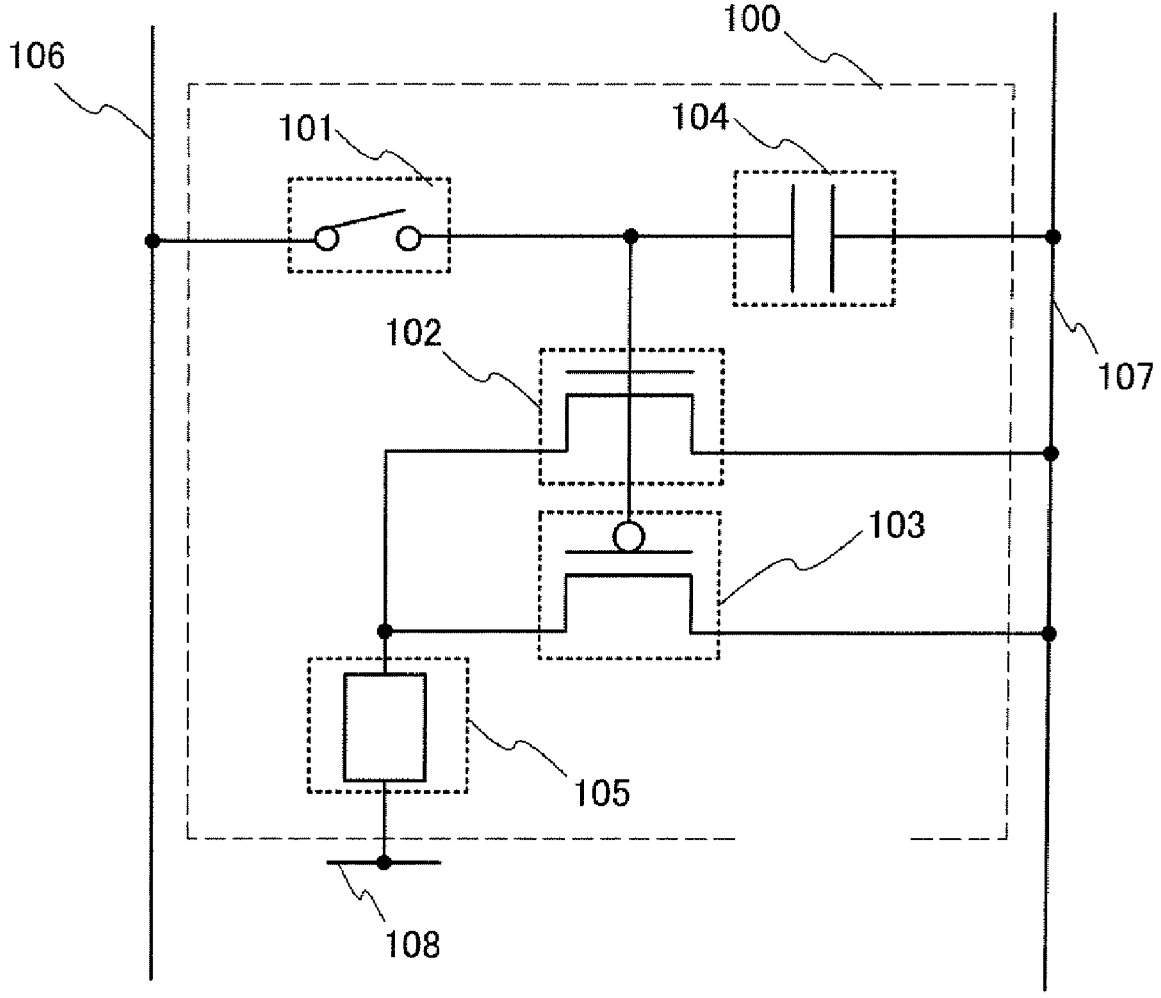
FIG. 1 is a diagram describing a pixel configuration according to an aspect of the present invention.

A circuit diagram of one pixel constituting part of a display device of the present invention will be described. FIG. 1 shows a circuit diagram of a pixel of the present invention. In FIG. 1, a pixel 100 includes a switching element 101, an n-channel transistor 102, a p-channel transistor 103, a capacitor element 104, and a display element 105. One of terminals of the switching element 101 is electrically connected to a data line 106 (also referred to as a first wiring), and the other terminal thereof is electrically connected to a gate terminal of the n-channel transistor 102, a gate terminal of the p-channel transistor 103, and one of electrodes of the capacitor element 104. A first terminal of the n-channel transistor 102, a first terminal of the p-channel transistor 103, and the other electrode of the capacitor element 104 are connected to a power supply line 107 (also referred to as a second wiring). A second terminal of the n-channel transistor 102 and a second terminal of the p-channel transistor 103 are connected to one of electrodes of the display element 105. The other electrode of the display element 105 is connected to a ground line 108 (referred to as a third wiring).

Figure 2:
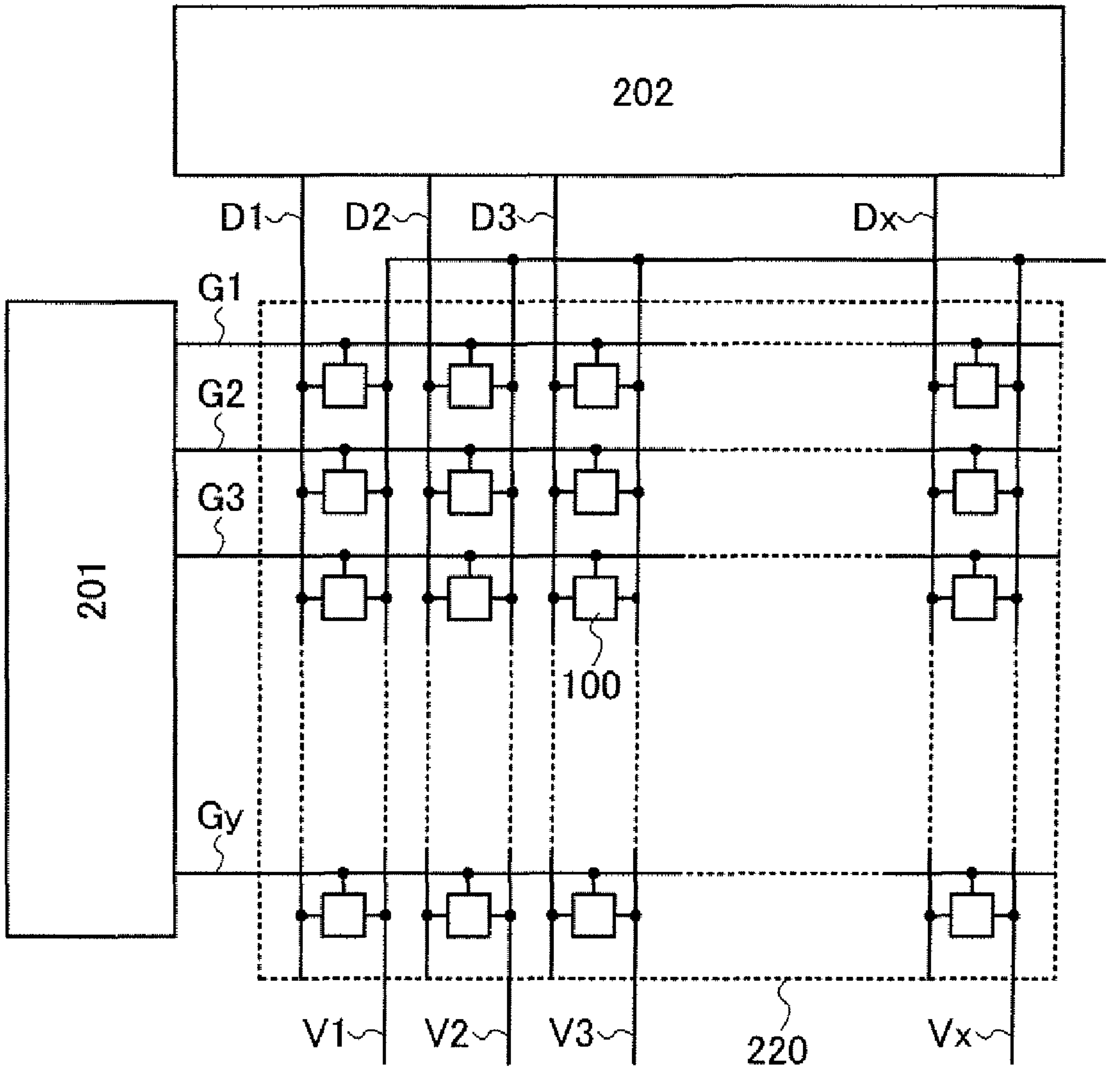
FIG. 2 is a block diagram describing a display device according to an aspect of the present invention.

FIG. 2 shows a block diagram of a display device provided with a plurality of pixels shown in FIG. 1. The display device includes a driver circuit portion comprising a scanning line driver circuit portion 201, a data line driver circuit portion 202, and/or the like and a pixel portion 220 in which a plurality of pixels 100 are arranged.

A signal outputted from the data line driver circuit portion 202 is inputted to data lines D1 to Dx and supplied to the pixels 100 in the pixel portion 220. A signal outputted from the scanning line driver circuit portion 201 is inputted to scanning lines G1 to Gy and transmitted to the pixels 100. In addition, power supply lines V1 to Vx are arranged parallel to the data lines and supply current to the pixels 100.

Note that terms such as first, second, third to Nth (N is a natural number) employed in this specification are used in order to avoid confusion between components and do not set a limitation on number.

Note that a variety of types of switches can be used as the switching elements 101. An electrical switch, a mechanical switch, and the like are given as examples. That is, there are no particular limitations on the kind of switch as long as the switch can control the flow of current. For example, a transistor can be used as the switch.

As the n-channel transistor 102 and the p-channel transistor 103, a variety of types of transistors can be used. Thus, there is no limitation on a type of transistors which can be used. For example, a thin film transistor (TFT) including a non-single-crystal semiconductor film formed over a substrate, which is typified by an amorphous silicon film, a polycrystal silicon film, a microcrystal silicon film, or the like, can be used. In the case of using such TFTs, there are various advantages. For example, since the transistors can be manufactured over a substrate, manufacturing cost can be reduced and the size of the substrate can be increased.

Note that in a transistor for driving a light-emitting element, in order to obtain sufficient current supply capability, a silicon nitride film or a silicon nitride oxide film which has a high dielectric constant can be used as a gate insulating film, instead of using a silicon oxide film. In the present invention, a transistor in which a gate insulating film containing nitrogen is used is particularly effective for suppressing the threshold voltage shift of the transistor. In the case where positive potential continues to be applied to a gate electrode of the transistor, the threshold voltage of the transistor shifts in the positive voltage direction, whereas in the case where negative potential continues to be applied thereto, the threshold voltage of the transistor shifts in the negative voltage direction. In the present invention, even when the threshold voltage of the transistor shifts, a polarity of potential is reversed and the reversed potential is applied to the gate electrode, so that the threshold voltage shifts in the opposite direction to be correct. Therefore, in the case where the absolute value of the potential applied to the gate of the transistor is larger or an ON time (a driving period) of the transistor is longer, the present invention is effective for suppressing the threshold voltage shift of the transistor.

In addition, a transistor including an oxide semiconductor or a compound semiconductor such as ZnO, a-InGaZnO, SiGe, or GaAs, a thin film transistor obtained by thinning such a compound semiconductor or an oxide semiconductor, or the like can be used as the n-channel transistor 102 and the p-channel transistor 103. In particular, a film of an oxide semiconductor can be formed by sputtering, and for example, a transistor can be formed at room temperature. Accordingly, the transistor can be formed directly on a substrate having low heat resistance such as a plastic substrate or a film substrate.

Further, a transistor formed by an inkjet method or a printing method can be used as the n-channel transistor 102 and the p-channel transistor 103. Accordingly, a transistor can be formed at room temperature, can be formed at a low vacuum, or can be formed using a large substrate. Also, since the transistor can be manufactured without using a photomask, a layout of the transistor can be changed easily.

In addition, the n-channel transistor 102 and the p-channel transistor 103 may have a GOLD (Gate Over Lapped Drain) structure or an LDD (Lightly Doped Drain) structure.

Note that as the n-channel transistor 102 and the p-channel transistor 103, a transistor which has at least three terminals of a gate, a drain, and a source is used. Each transistor has a channel region between a drain region and a source region, and current can flow through the drain region, the channel region, and the source region. However, it is difficult to determine which terminal is the source or the drain because the source and the drain change depending on the structure, the operating condition, and the like of the transistor. Thus, in this specification, a region functioning as a source and a drain may not be called the source or the drain. In this case, for example, each of the region functioning as a source or the region functioning as a drain may be referred to as a first terminal or a second terminal. Note that a region functioning as a gate is referred to as a gate terminal.

Note that it is possible to omit the capacitor element 104 by using gate capacitance of the n-channel transistor 102 or the p-channel transistor 103 as a substitute therefor.

Note that one pixel corresponds to one component that can control luminance. For example, one pixel shows one color element for expressing luminance. Thus, in the case of a color display device composed of color elements of R (Red), G (Green) and B (Blue), the minimum unit of an image is composed of three pixels of an R pixel, a G pixel and a B pixel. Note that the color elements are not limited to three colors, and color elements of more than three colors may be used or a color other than RGB may be added.

Note that pixels are provided (arranged) in matrix in some cases. Here, the case where pixels are provided (arranged) in matrix includes the case where the pixels are arranged in a straight line and the case where the pixels are arranged in a jagged line, in a longitudinal direction or a lateral direction. Therefore, in the case of performing full color display with three color elements (e.g., RGB), a case where pixels are arranged in stripes and a case where dots of the three color elements are arranged in a delta pattern are included. Note that the color elements are not limited to three colors, and more than three color elements may be employed. RGBW (W corresponds to white), RGB plus one or more of yellow, cyan, magenta, and the like, or the like is given as an example. Further, the sizes of display regions may be different between respective dots as regions in which color elements are provided. Thus, power consumption can be reduced and the life of a display element can be prolonged.

In this specification, description that A and B are connected includes the case where A and B are electrically connected. The case where A and B are electrically connected also includes the case where the object which causes some sort of electric action is provided between A and B.

The display element 105 indicates a light-emitting element such as an EL element (an organic EL element, an inorganic EL element, or an EL element including an organic substance and an inorganic substance). Note that since the EL element emits light by itself, it has high visibility and does not need a backlight which is required in a liquid crystal display device; thus, it is suitable for reduction in thickness of a display device. Moreover, the EL element does not have limitation on the viewing angle, which is preferable for using a display device. Although, this embodiment mode is described based on assumption that an organic EL element is used in a display device, the present invention may be a display device using another light-emitting element. An organic EL element has a layer (hereinafter referred to as an organic layer) including a material that can emit light (electroluminescence) generated by application of an electric field to the material, an anode layer, and a cathode layer. As electroluminescence, there are luminescence (fluorescence) emitted by energy relaxation of an injected electron from a singlet-excited state to a ground state and luminescence (phosphorescence) emitted by energy relaxation of an injected electron from triplet-excited state to a ground state. The display device of the present invention may use either one of fluorescence and phosphorescence or both fluorescence and phosphorescence.

In addition, a display device corresponds to a device which has a display element and includes a plurality of pixels each having the display element. In addition, the display device may include a peripheral driver circuit for driving the plurality of pixels. The peripheral driver circuit for driving the plurality of pixels may be formed over the same substrate as the plurality of pixels may be. In addition, a display device may also include a peripheral driver circuit provided over a substrate by wire bonding or bump bonding, namely, an IC chip connected by chip on glass (COG) or an IC chip connected by TAB or the like. Further, the display device may include a flexible printed circuit (FPC) to which an IC chip, a resistor, a capacitor, an inductor, a transistor, or the like is attached. Note that the display device may include a printed wiring board (PWB) which is connected through a flexible printed circuit (FPC) and to which an IC chip, a resistor, a capacitor, an inductor, a transistor, or the like is attached.

Next, functions and operation of the pixel 100 in the circuit diagram of the pixel shown in FIG. 1 are described in detail. With use of FIGS. 3A to 3F, in the display element 105, a first conduction state, a first conduction retention state retaining the first conduction state, a second conduction state, a second conduction retention state retaining the second conduction state, a non-conduction state, and a non-conduction retention state retaining the non-conduction state are individually described. Here, any of a first data line potential $V_{sig}$ (>0), a second data line potential $-V_{sig}$ (<0), or a third data line potential $V_{off}$ is applied to the data line 106, a potential $V_{DD}$ is applied to the power supply line 107, and a potential GND is applied to the ground line 108.

The first data line potential $V_{sig}$ is a potential which turns on the n-channel transistor 102 and turns off the p-channel transistor 103 when it is applied to the gate of the n-channel transistor 102 and the gate of the p-channel transistor 103. By application of the first data line potential $V_{sig}$ as a positive potential to the gate of the n-channel transistor 102 and the gate of the p-channel transistor 103, the positive potential continues to be supplied to the gate of the n-channel transistor 102 and the gate of the p-channel transistor 103 during the first retention state. Accordingly, the threshold voltage of each transistor shifts in the positive voltage direction. Note that when the potential $V_{DD}$ of the power supply line is a positive potential and the n-channel transistor 102 is turned on, in order to avoid reduction in potential propagated to the second terminal (which is connected to the display element 105) of the n-channel transistor 102 due to the threshold voltage of the n-channel transistor 102, it is preferable to set the first data line potential $V_{sig}$ to $V_{sig}+V_{th}N$ in advance where the threshold voltage of the n-channel transistor is referred to as $V_{th}N$. In this embodiment mode, the first data line potential is represented as $V_{sig}$ which includes the threshold voltage $V_{th}N$.

The second data line potential $-V_{sig}$ is a potential which turns off the n-channel transistor 102 and turns on the p-channel transistor 103 when it is applied to the gate of the n-channel transistor 102 and the gate of the p-channel transistor 103. By application of the second data line potential $-V_{sig}$ as a negative potential to the gate of the n-channel transistor 102 and the gate of the p-channel transistor 103, the negative potential continues to be supplied to the gate of the n-channel transistor 102 and the gate of the p-channel transistor 103 during the second conduction retained state. Accordingly, the threshold voltage of each transistor shifts in the negative direction.

The third data line potential $V_{off}$ is a potential which turns off both the n-channel transistor 102 and the p-channel transistor 103 when it is applied to the gate of the n-channel transistor 102 and the gate of the p-channel transistor 103. The potential which turns off both the n-channel transistor 102 and the p-channel transistor 103 fulfills the relation of $$V_{DD}+V_{th}P<V_{off}<V_{th}N$$

where $V_{th}N$ is a threshold voltage which is made to shift in the positive voltage direction by adding an impurity imparting N conductivity type to a channel of the n-channel transistor 102, in other words, making the n-channel transistor 102 be enhancement type (also referred to as normally off type) and where $V_{th}P$ is a threshold voltage which is made to shift in a negative voltage direction by adding an impurity imparting P conductivity type to a channel of the p-channel transistor 103, in other words, making the p-channel transistor 102 be enhancement type. When $V_{off}$ fulfills the relation of $V_{DD}+V_{th}P<V_{off}<V_{th}N$, the potential which turns off both the n-channel transistor 102 and the p-channel transistor 103 can be set as well as the potential which turns on the n-channel transistor 102 or the p-channel transistor 103.

Figure 3A:
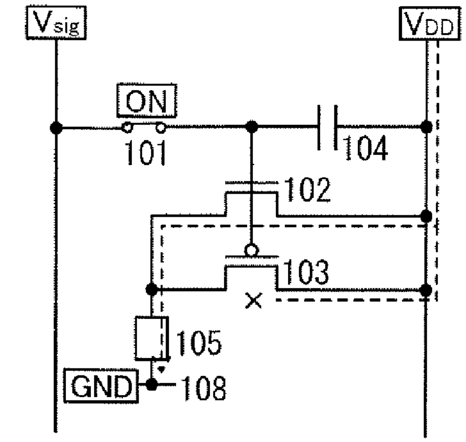
FIGS. 3A to 3F are diagrams each describing operation of a pixel according to an aspect of the present invention.

First, the first conduction state is described with reference to FIG. 3A. The first conduction state is a state where the n-channel transistor 102 is turned on and the p-channel transistor 103 is turned off, so that the power supply line 107 and one of electrodes of the display element 105 are electrically connected. During the first conduction state, the first data line potential $V_{sig}$ is applied to the data line 106, the potential $V_{DD}$ is applied to the power supply line 107, and the potential GND is applied to the ground line 108. At this time, by turning on the switching element 101, the first data line potential $V_{sig}$ of the data line is applied to the gate of the n-channel transistor 102 and the gate of the p-channel transistor 103. The first data line potential $V_{sig}$ turns on the n-channel transistor 102 and turns off the p-channel transistor 103. As a result, the power supply line 107 and one of electrodes of the display element 105 are electrically connected, and current flows along a path of a dotted line shown in FIG. 3A, whereby the display element emits light.

Figure 3B:
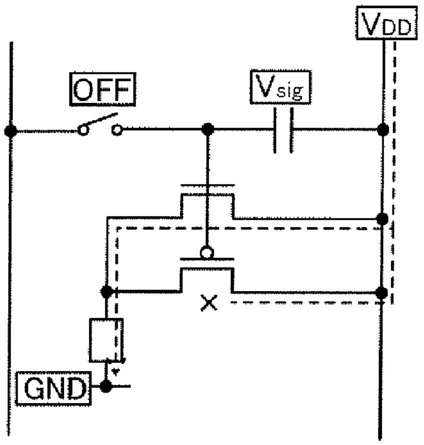

Next, the first conduction retention state is described with reference to FIG. 3B. The first conduction retention state is a state where the above-described first conduction state is retained. During the first conduction retention state, the switching element 101 is in an OFF state in order to electrically cut off the data line 106 from the gate of the n-channel transistor 102 and the gate of the p-channel transistor 103. The first data line potential $V_{sig}$ is retained in one of electrodes of the capacitor element 104, and the potential $V_{DD}$ and the potential GND are applied to the power supply line 107 and the ground line 108, respectively. Thus, even when the switching element 101 is in an OFF state, the first data line potential $V_{sig}$ can be applied to the gate of the n-channel transistor 102 and the gate of the p-channel transistor 103. As a result, the power supply line 107 and the one of the electrodes of the display element 105 are electrically connected, and current flows along a path of a dotted arrow shown in FIG. 3B, whereby the display element emits light.

Figure 3C:
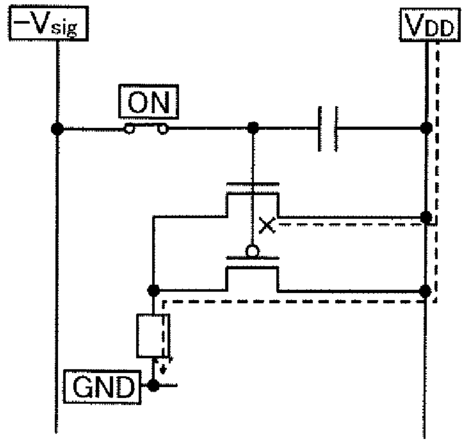

Next, the second conduction state is described with reference to FIG. 3C. The second conduction state is a state where the n-channel transistor 102 is turned off and the p-channel transistor 103 is turned on, so that the power supply line 107 and one of electrodes of the display element 105 are electrically connected. During the second conduction state, the second data line potential $-V_{sig}$ is applied to the data line 106, and the potential $V_{DD}$ and the potential GND are applied to the power supply line 107 and the ground line 108, respectively. At this time, by turning on the switching element 101, the second data line potential $-V_{sig}$ of the data line is applied to the gate of the n-channel transistor 102 and the gate of the p-channel transistor 103. The second data line potential $-V_{sig}$ turns off the n-channel transistor 102 and turns on the p-channel transistor 103. As a result, the power supply line 107 and one of the electrodes of the display element 105 are electrically connected, and current flows along a path of a dotted arrow shown in FIG. 3C, whereby the display element emits light to display images. The second conduction state is similar to the first conduction state, in which the power supply line 107 and one of the electrodes of the display element 105 are electrically connected, so that the display element can display images; however, ON and OFF of the n-channel transistor 102 and the p-channel transistor 103 are switched between the first conduction state and the second conduction state.

Figure 3D:
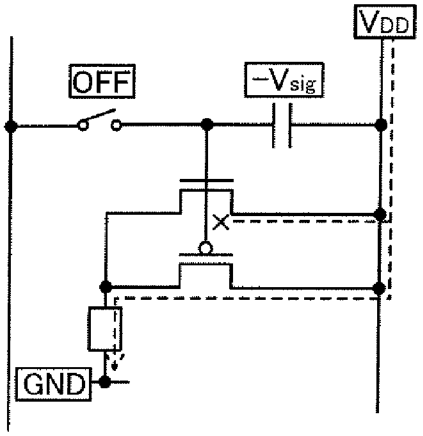

Next, the second conduction retention state is described with reference to FIG. 3D. The second conduction retention state is a state where the above-described second conduction state is retained. During the second conduction retention state, the switching element 101 is in an OFF state in order to electrically cut off the data line 106 from the gate of the n-channel transistor 102 and the gate of the p-channel transistor 103. The negative second data line potential $-V_{sig}$ is retained in one of the electrodes of the capacitor element 104, and the potential $V_{DD}$ and the potential GND are applied to the power supply line 107 and the ground line 108, respectively. Thus, even when the switching element 101 is in an OFF state, the second data line potential $-V_{sig}$ can be applied to the gate of the n-channel transistor 102 and the gate of the p-channel transistor 103. As a result, the power supply line 107 and the one of the electrodes of the display element 105 are electrically connected, and current flows along a path of a dotted arrow shown in FIG. 3D, whereby the display element emits light.

Figure 3E:
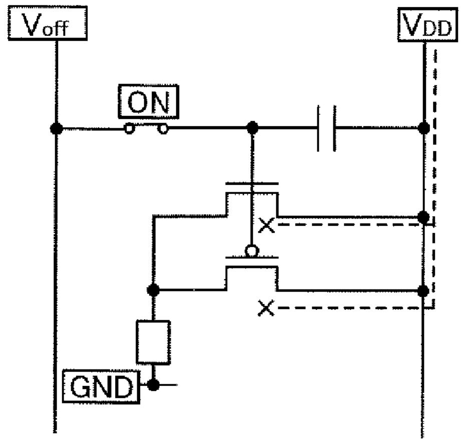
Figure 3F:
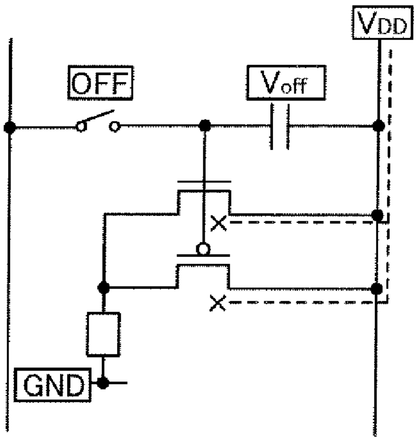

Next, the non-conduction state is described with reference to FIG. 3E. The non-conduction state is a state where both the n-channel transistor 102 and the p-channel transistor 103 are turned off, so that the power supply line 107 and one of electrodes of the display element 105 are not electrically connected. During the non-conduction state, the third data line potential $V_{off}$ is applied to the data line 106, and the potential $V_{DD}$ and the potential GND are applied to the power supply line 107 and the ground line 108, respectively. At this time, by turning on the switching element 101, the third data line potential $V_{off}$ of the data line is applied to the gate of the n-channel transistor 102 and the gate of the p-channel transistor 103. The third data line potential $V_{off}$ turns off both the n-channel transistor 102 and the p-channel transistor 103. By turning off both the n-channel transistor 102 and the p-channel transistor 103, the power supply line 107 and the one of the electrodes of the display element 105 are not electrically connected, and current does not flow along a path of a dotted arrow shown in FIG. 3E, whereby the display element does not emit light.

Next, the non-conduction retention state is described with reference to FIG. 3E The non-conduction retained state is a state where the above-described non-conduction state is retained. During the non-conduction retained state, the switching element 101 is in an OFF state in order to electrically cut off the data line 106 form the gate of the n-channel transistor 102 and the gate of the p-channel transistor 103. The third data line potential $V_{off}$ is retained in one of electrodes of the capacitor 104, and the potential $V_{DD}$ and the potential GND are applied to the power supply line 107 and the ground line 108, respectively. Thus, even when the switching element 101 is in an OFF state, the third data line potential $V_{off}$ can be applied to the gate of the n-channel transistor 102 and the gate of the p-channel transistor 103. As a result, current does not flow along a path of a dotted arrow shown in FIG. 3F, whereby the display element does not emit light.

Figure 4:
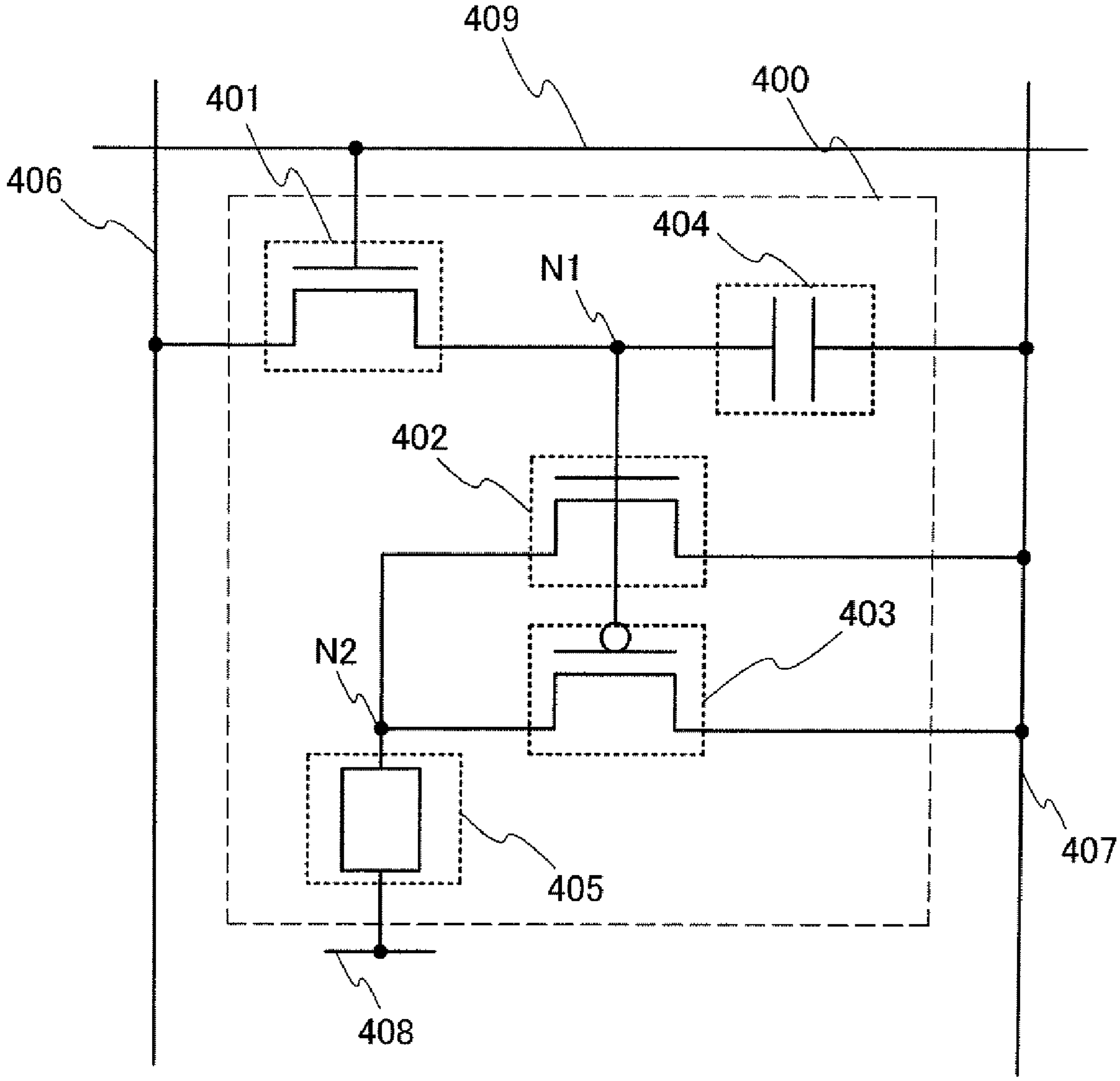
FIG. 4 is a diagram describing a pixel configuration according to an aspect of the present invention.

Next a circuit diagram of one pixel constituting a part of the display device of the present invention is described with reference to FIG. 4 which embodies the circuit diagram shown in FIG. 1. In FIG. 4, a pixel 400 includes a switching transistor 401, an n-channel transistor 402, a p-channel transistor 403, a capacitor element 404, and a display element 405. A first terminal of the switching transistor 401 is electrically connected to a data line 406, a gate terminal thereof is electrically connected to a scanning line 409, and a second terminal thereof is electrically connected to a gate terminal of the n-channel transistor 402, a gate terminal of the p-channel transistor 403, and one of electrodes of the capacitor element 404. A first terminal of the n-channel transistor 402, a first terminal of the p-channel transistor 403, and the other electrode of the capacitor element 404 are electrically connected to a power supply line 407. A second terminal of the n-channel transistor 402 and a second terminal of the p-channel transistor 403 are connected to one of electrodes of the display element 405. The other electrode of the display element 405 is connected to a ground line 408. Note that the circuit diagram of the pixel shown in FIG. 4 is different from the circuit diagram of the pixel shown in FIG. 1 in that the n-channel switching transistor 401 as the switching element 101 and the scanning line 409 for controlling ON or OFF of the switching transistor 401 are provided. In addition, in FIG. 4, a node of the gate terminal of the n-channel transistor 402 and the gate terminal of the p-channel transistor 403 is referred to as N1, and a node of one of the electrodes of the display element 405 is referred to as N2.

A timing chart of the circuit diagram of the pixel shown in FIG. 4 and change of potential of each wiring and node are described with reference to FIGS. 5A and 5B.

Figure 5A:
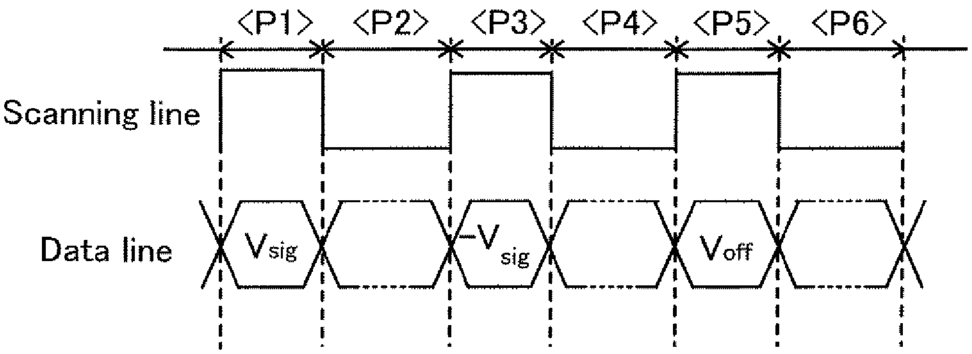
FIGS. 5A and 5B are diagrams describing operation of a pixel according to an aspect of the present invention.

First, FIG. 5A is described. Periods P1 to P6 shown in FIG. 5A correspond to the first conduction state, the first conduction retention state, the second conduction state, the second conduction retention state, the non-conduction sate, and the non-conduction retention state described in FIGS. 3A to 3F, respectively. During the period P1, the period P3, and the period P5, potential of the scanning line 409 is set to a high potential level (also referred to as a H potential or $V_H$), and during the period P2, the period P4, and the period P6, potential of the scanning line 409 is set to a low potential level (also referred to as an L potential or $V_L$). During the period P1, the first data line potential $V_{sig}$ is inputted to the data line; during the period P2, the potential which has been inputted to the data line in the period P1 is retained regardless of a potential of the data line; during the period P3, the second data line potential $-V_{sig}$ is inputted to the data line; during the period P4, the potential which has been inputted to the data line in the period P3 is retained regardless of a potential of the data line; during the period P5, the third data line potential $V_{off}$ is inputted to the data line; and during the period P6, the potential which has been inputted to the data line in the period P5 is retained regardless of a potential of the data line.

Figure 5B:
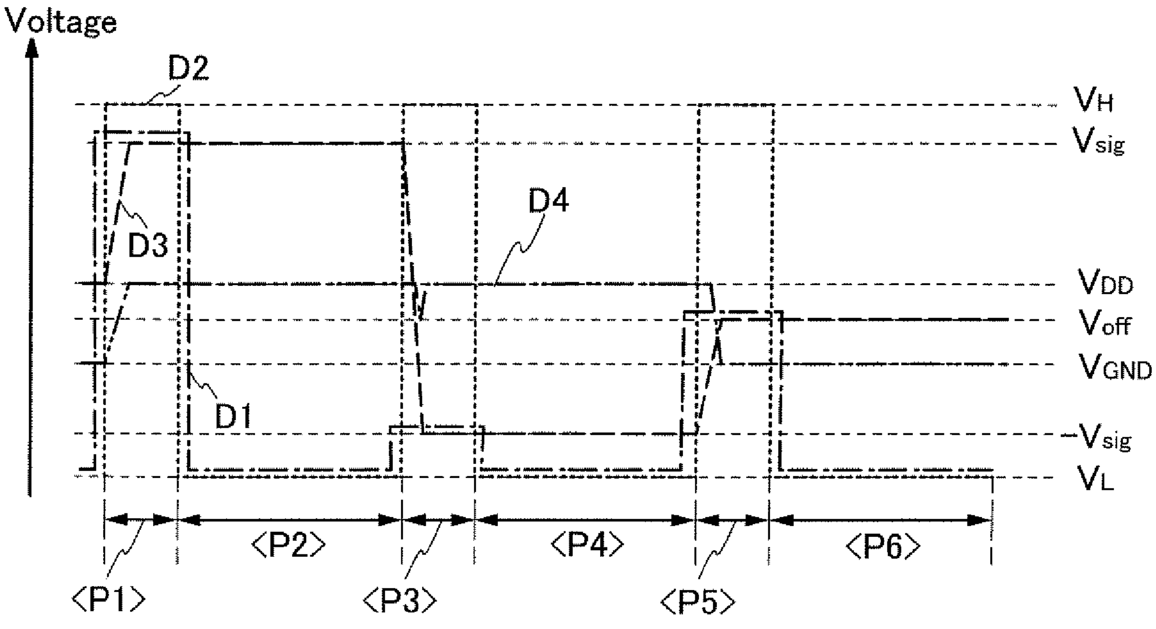

In FIG. 5B, change of potentials D1 to D4 in each of the periods P1 to P6 is described where the potential D1 is a potential of the data line 406, the potential D2 is a potential of the scanning line 409, the potential D3 is a potential of the node N1, and the potential D4 is a potential of the node N2.

During the period P1, the potential D2 of the scanning line 409 is set to $V_H$, the $V_{sig}$ as the potential D1 of the data line 406 is inputted to the node N1, and then the potential D3 of the node N1 becomes $V_{sig}$. Since the potential D3 of the node N1 is $V_{sig}$, the absolute value of a potential difference between the gate and the source of the n-channel transistor 402 is larger than the threshold voltage, whereby the power supply line 407 and one of electrodes of the display element are electrically connected. Then, the potential D4 of the node N2 becomes the potential $V_{DD}$ of the power supply line 407.

During the period P2, the potential D2 of the scanning line 409 is set to $V_L$, and the potential $V_{sig}$ which has been inputted in the period P1 is retained in the node N1 by the capacitor element 404 regardless of the potential D1 of the data line 406. Then, since the potential D3 of the node N1 is $V_{sig}$, the absolute value of the potential difference between the gate and the source of the n-channel transistor 402 is larger than the threshold voltage, whereby electrical connection between the power supply line 407 and the one of the electrodes of the display element is retained, which is similar to the period P1. Thus, the potential D4 of the node N2 is retained as the potential $V_{DD}$ of the power supply line 407.

During the period P3, the potential D2 of the scanning line 409 is set to $V_H$, $-V_{sig}$ as the potential D1 of the data line 406 is input to the node N1, and then the potential D3 of the node N1 becomes $-V_{sig}$. Since the potential D3 of the node N1 is $-V_{sig}$, the absolute value of the potential difference between the gate and the source of the p-channel transistor 403 is larger than the threshold voltage, whereby the power supply line 407 and one of the electrodes of the display element is electrically connected. Then, the potential D4 of the node N2 becomes the potential $V_{DD}$ of the power supply line 407. Note that there is a period during which both the n-channel transistor 402 and the p-channel transistor 403 are turned off at the time of switching the potential D3 of the node N1 from $V_{sig}$ to $-V_{sig}$ in accordance with the shift from the period P2 to the period P3; thus, a period during which the potential D4 of the node N2 does not retain the potential $V_{DD}$ exists. However, since a data signal is inputed in extreme short period, the period during which the potential $V_{DD}$ is not retained does not affect the display so much.

During the period P4, the potential D2 of the scanning line 409 is set to $V_L$, and the potential $-V_{sig}$ which has been inputted in the period P3 is retained in the node N1 by the capacitor element 404 regardless of the potential P2 of the data line 406. Since the potential D3 of the node N1 is $-V_{sig}$, the absolute value of the potential difference between the gate and the source of the p-channel transistor 403 is larger than the threshold voltage, whereby electrical connection between the power supply line 407 and the one of electrodes of the display element is retained, which is similar to the period P3. Then, the potential D4 of the node N2 is retained as the potential $V_{DD}$ of the power supply line 407.

During the period P5, the potential D2 of the scanning line 409 is set to $V_H$, and $V_{off}$ that is the potential D1 of the data line 406 is inputted to the node N1, whereby the potential D3 of the node N1 becomes $V_{off}$. Since the potential D3 of the node N1 is $V_{off}$, the absolute value of the potential difference between the gate and the source of each of the n-channel transistor 402 and the p-channel transistor 403 is lowered than the threshold voltage of each transistor, whereby the power supply line 407 and one of the electrodes of the display element are not electrically connected Then, the potential D4 of the node N2 becomes the potential $V_{GND}$ of the ground line 408.

Note that it is preferable to set the period P1 and the period P3 to have the same length of period, and it is also preferable to set the period P2 and the period P4 to have the same length of period. As an example, a circuit with a function of controlling the threshold value is provided outside the data line driver circuit portion, whereby the data line potential whose polarity is reversed can be inputted even during the same light-emitting period, i.e., the conduction state period. Accordingly, the threshold voltages of the n-channel transistor and the p-channel transistor can be controlled.

Note that the display element may be driven by reversing the whole frame in the first conduction state or the second conduction state, which has been described above, per one frame period. Alternatively, data line potentials which are reversed in the first conduction state or the second conduction state per one pixel in the row direction or the column direction may be inputted to the pixels and the data line potentials may be reversed per one frame period so as to drive the display element. Further alternatively, data line potentials which are reversed in the first conduction state or the second conduction per one row or one column of pixels may be inputted to the pixels and the data line potentials may be reversed per one frame period so as to drive the display element.

In accordance with the present invention, in a light-emitting period of an EL element, a polarity of potential applied to gate electrodes of an n-channel transistor and a gate electrode of a p-channel transistor for driving the EL element can be reversed to be inputted thereto without influence on display as described above in the first conduction state and the second conduction state or the period P2 and the period P4. Accordingly, even when light continues to be emitted for a certain period, the EL element can be driven without decrease in luminance or appearance of flicker of a still image. This is because the threshold voltage of a driving transistor can be controlled by reversing the polarity of potential and applying the potential and its revered potential alternately to the gate electrode of the driving transistor Note that the contents described in each drawing in this embodiment mode can be freely combined with or replaced with the contents described in another embodiment mode as appropriate.

Embodiment Mode 2

In this embodiment mode, a configuration which is different from that of the circuit diagram of the pixel described in Embodiment Mode 1 will be described. In this embodiment mode, digital time gray scale driving is exemplified as an example of a driving method of a pixel which constitutes part of a display device.

Figure 6A:
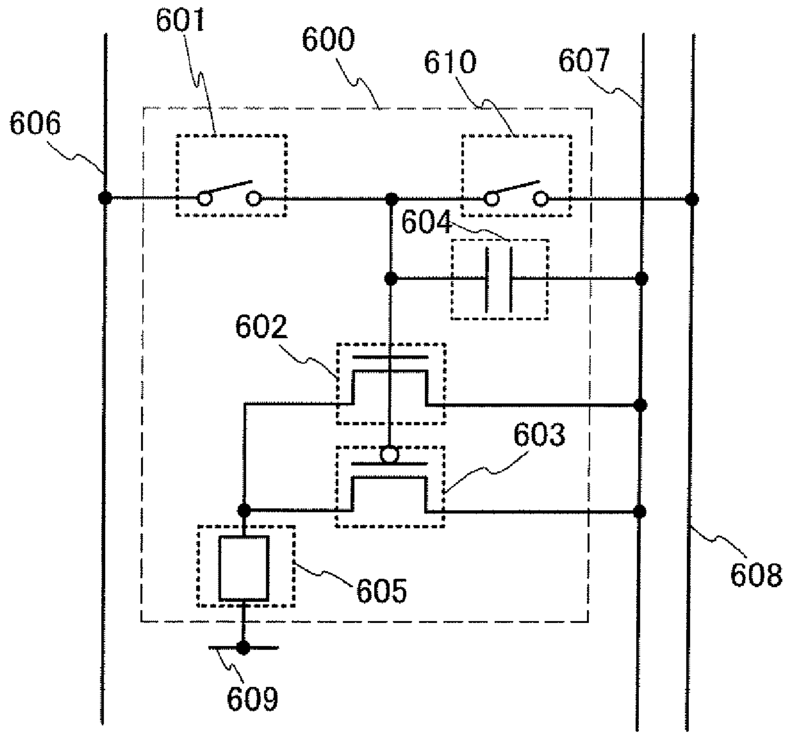
FIGS. 6A and 6B are diagrams describing a pixel configuration according to an aspect of the present invention.
Figure 6B:
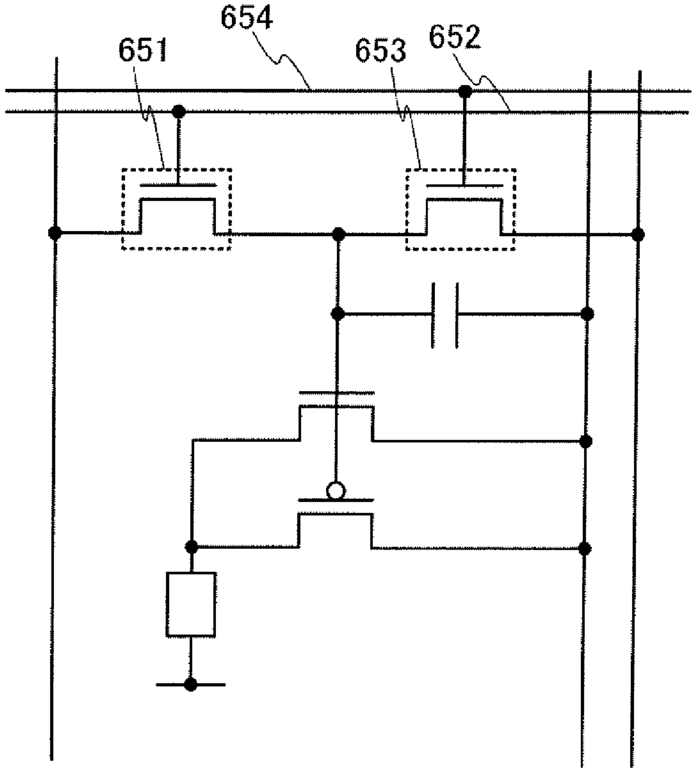

FIGS. 6A and 6B show an example of a pixel configuration to which digital time gray scale driving can be applied.

FIG. 6A is a circuit diagram of a pixel of this embodiment mode. In FIG. 6A, a pixel 600 includes a first switching element 601, an n-channel transistor 602, a p-channel transistor 603, a capacitor element 604, a display element 605, and a second switching element 610. One of terminals of the first switching element 601 is electrically connected to a data line 606, and the other terminal thereof is electrically connected to a gate terminal of the n-channel transistor 602, a gate terminal of the p-channel transistor 603, and one of electrodes of the capacitor element 604. One of terminals of the second switching element 610 is electrically connected to a second power supply line 608, and the other terminal thereof is electrically connected to the gate terminal of the n-channel transistor 602, the gate terminal of the p-channel transistor 603, and the one of electrodes of the capacitor element 604. A first terminal of the n-channel transistor 602, a first terminal of the p-channel transistor 603, and the other electrode of the capacitor element 604 are electrically connected to a first power supply line 607. A second terminal of the n-channel transistor 602 and a second terminal of the p-channel transistor 603 are connected to one of electrodes of the display element 605. The other electrode of the display element 605 is connected to a ground line 609. That is, the pixel 600 shown in FIG. 6A has a configuration in which the second switching element 610 is added to the pixel 100 shown in FIG. 1.

FIG. 6B is a circuit diagram which embodies the pixel shown in FIG. 6A. FIG. 6B illustrates a first n-channel switching transistor 651 and a first scanning line 652 for controlling the first switching transistor 651 as the first switching element shown in FIG. 6A, and an second n-channel switching transistor 653 and a second scanning line 654 for controlling the second switching transistor 653 as the second switching element shown in FIG. 6A.

Note that in FIGS. 6A and 6B, any of a first data line potential $V_{sig}$, a second data line potential $-V_{sig}$, or a third line potential $V_{off}$ is applied to the data line 606; a potential $V_{DD}$ is applied to the first power supply line 607; a potential $V_{GND}$ is applied to the ground line 609; and a third data potential $V_{off}$ is applied to the second power supply line 608.

With reference to the circuit diagram shown in FIG. 6A, an erasing operation of the data line potential retained by one of electrodes of the capacitor element 604 is described. In the erasing operation, the second switching element 610 is turned on, so that the third data line potential $V_{off}$ is applied to the gate of the n-channel transistor 602 and the gate of the p-channel transistor 603. That is, the absolute value of the potential difference between the gate and a source of each of the n-channel transistor 602 and the p-channel transistor 603 is lowered than the threshold voltage of each transistor. Thus, the n-channel transistor 602 and the p-channel transistor 603 can be turned off by design. Note that in the erasing operation in the case of FIG. 6B, the second switching transistor 653 is turned on by the second scanning line 654, so that the third data line potential $V_{off}$ is applied to the gate of the n-channel transistor 602 and the gate of the p-channel transistor 603.

Figures 7A, 7B:
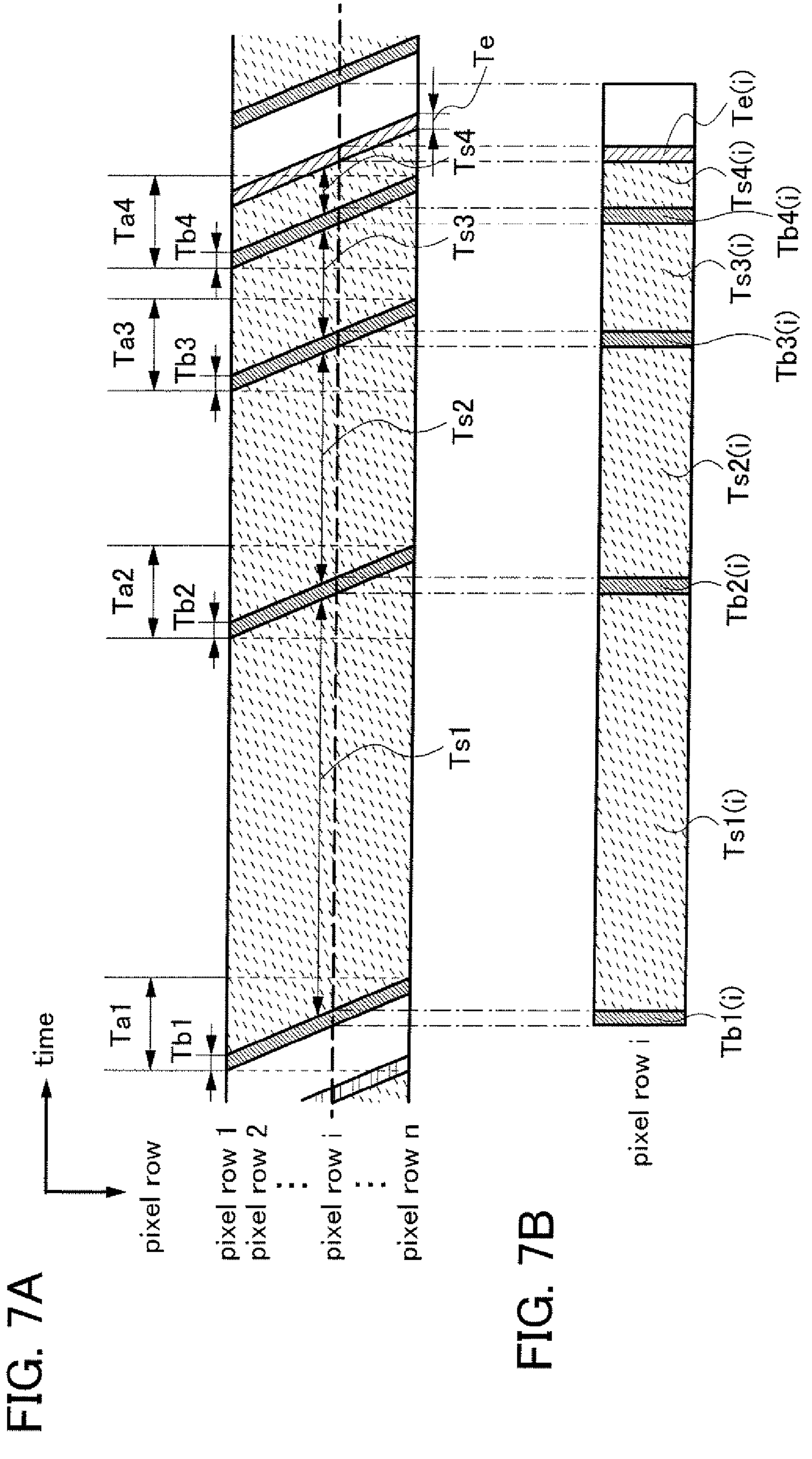
FIGS. 7A and 7B are diagrams describing operation of a pixel according to an aspect of the present invention.

FIGS. 7A and 7B are timing charts showing an example of digital time gray scale driving. Here, a driving method for the circuit diagram of FIG. 6B, in the case of setting a data retention time shorter than an address period by providing an erasing period, is described using FIG. 7A.

First, in an address period Ta1, a pixel scanning signal is inputted to the first scanning line 652 shown in FIG. 6B sequentially from a first row, and a pixel is selected. Then, the data line potential is inputted to the pixel from the data line while the pixel is selected. After the data line potential is inputted to the pixel, the pixel retains the data line potential until a new data line potential is inputted again. Depending on this inputted data line potential, lighting or non lighting in each pixel during a sustaining period Ts1 is controlled. In a row in which the operation of inputting the data line potential is completed, the pixel is immediately put in a lighting or non-lighting state in accordance with the inputted data line potential. The same operation is performed up to the last row, and the address period Ta1 ends. Then, a signal inputted in a next subframe period follows sequentially from a row in which the data retention time ends. Similarly, in address periods Ta2, Ta3, and Ta4, the data line potential is inputted to the pixel, and lighting or non lighting of the pixel during sustaining periods Ts2, Ts3, and Ts4 are controlled depending on the data line potential. The end of the sustaining period Ts4 is set by the start of an erasing operation. This is because, when the signal inputted to the pixel is erased in an erasing time Te of each row, the pixel is forced to be in a non-lighting state regardless of the data line potential inputted to the pixel in the address period until a new data line potential is inputted to the pixel. In other words, the data retention time ends from a pixel in a row where the erasing time Te starts.

Here, the i-th pixel row is described with reference to FIG. 7B. In the address period Ta1, a pixel scanning signal is inputted to the first scanning line 652 shown in FIG. 6B in order from a first row, and a pixel is selected in the i-th row. Then, in a period Th1(*i*), while the pixel in the ith row is selected, a data line potential is inputted to the pixel in the i-th row. Then, after the data line potential is inputted into the pixel in the i-th row, the pixel in the i-th row retains the inputted signal until a new signal is inputted to the pixel again. Depending on the inputted data line potential, lighting or non lighting of the pixel in the i-th row during a sustain period Ts1(*i*) is controlled. That is, the pixel in the i-th row is immediately put in a lighting or non-lighting state in accordance with the data line potential inputted to the pixel after inputting the data line potential to the i-th row is completed. Similarly, in each of the address periods Ta2, Ta3, and Ta4, the data line potential is inputted to the pixel in the i-th row, and lighting or non lighting of the pixel in the i-th row during each of the sustain periods Ts2(*i*), Ts3(*i*), and Ts4(*i*) are controlled depending on the data line potential. Then, the end of the sustain period Ts4(*i*) is set by the start of an erasing operation. This is because the pixel is forced to be in a non-lighting state regardless of the data line potential inputted to the pixel in the i-th row in an erasing time Te(i). That is, the data retention time of the pixel in the i-th row ends when the erasing time Te(i) starts.

Thus, a display device with a high-level grayscale and a high duty ratio (ratio of a lighting period in one frame period) can be provided, in which the address period and the sustain period are not divided and in which data retention time is shorter than the address period. Since a lighting period of a display element in one frame period can be longer, luminance of the display element can be suppressed. Therefore, reliability of a display element can be improved.

Note that the case of expressing a 4-bit gray scale is described here, but the number of bits and gray scale levels are not limited thereto. Note that lighting is not needed to be performed in order of Ts1, Ts2, Ts3, and Ts4, and the order may be random or light may be emitted by dividing the whole period into a plurality of periods. The lighting time of Ts1, Ts2, Ts3, and Ts4 is not needed to be a power of two, and may be the same length or slightly different from a power of two.

In accordance with the present invention, in a light-emitting period of an EL element, a polarity of potential applied to gates of an n-channel transistor and a p-channel transistor for driving the EL element can be reversed and inputted thereto without influence on display, as described in Embodiment Mode 1. In the case of using the display device provided with pixels capable of employing digital time gray scale driving described in this embodiment mode, the present invention is particularly preferable to control a time in which lighting and non lighting are repeated every certain period of time. Furthermore, even when light is emitted continuously for a certain period, the EL element can be driven without decrease in luminance and appearance of flicker of the still image. This is because the threshold voltage of a transistor can be controlled by reversing the polarity of potential and applying the potential and its revered potential alternately to the gate of the driving transistor.

Note that the contents described in each drawing in this embodiment mode can be optionally combined with or replaced with the contents described in another embodiment mode as appropriate.

Embodiment Mode 3

Figure 8:
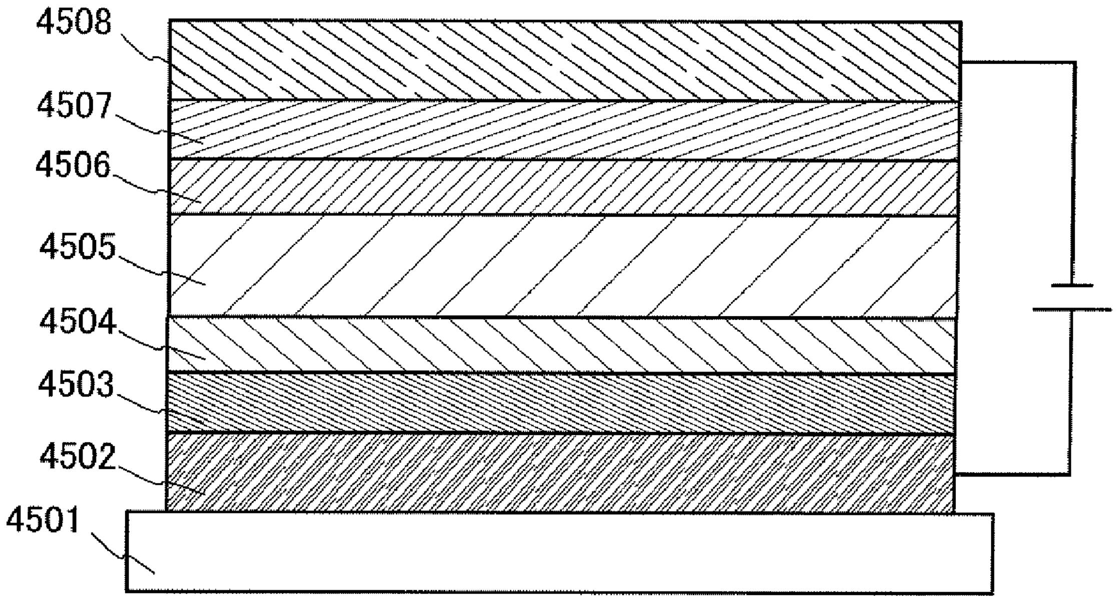
FIG. 8 illustrates an example of a display element according to an aspect of the present invention.

In this embodiment mode, an example of a light-emitting element which can be applied to a display element is shown in FIG. 8.

An element structure is such that an anode 4502, a hole injecting layer 4503 formed of a hole injecting material, a hole transporting layer 4504 formed of a hole transporting material, a light-emitting layer 4505, an electron transporting layer 4506 formed of an electron transporting material, an electron injecting layer 4507 formed of an electron injecting material, and a cathode 4508 are stacked over a substrate 4501.

Here, the light-emitting layer 4505 is formed of only one kind of a light-emitting material in some cases and formed of two or more kinds of materials in other cases. In addition, an element structure of the present invention is not limited to this structure.

Further, in addition to a stacked-layer structure shown in FIG. 8 in which each functional layer is stacked, there is a variety of structures such as an element using a high molecular compound or a high-efficiency luminescence element utilizing a triplet light-emitting material which can emits light through a triplet excited state as a light-emitting layer. These variations can also be applied to a white light-emitting element or the like which can be obtained by controlling a recombination of carriers through a hole blocking layer and providing two light-emitting regions.

Next, a manufacturing method of the element shown in FIG. 8 is described. First, a hole injecting material, a hole transporting material, and a light-emitting material are sequentially deposited over the substrate 4501 provided with the anode 4502 (ITO (indium tin oxide)). Next, an electron transporting material and an electron injecting material are deposited, and finally, the cathode 4508 is formed by evaporation.

Described below are materials suitable for the hole injecting material, the hole transporting material, the electron transporting material, the electron injecting material, and the light-emitting material.

As the hole injecting material, a porphyrin compound, phthalocyanine (hereinafter referred to as "$H_2Pc$"), copper phthalocyanine (hereinafter referred to as "CuPc"), or the like among organic compounds is efficient to inject a hole to a light-emitting material. In addition, a material that has a smaller value of an ionization potential than that of the hole transporting material to be used and has a hole transporting function can also be used as the hole injecting material. Further; to the hole injecting materials, a material obtained by subjecting a conductive high molecular compound to chemical doping can be used, which includes polyethylene dioxythiophene (hereinafter referred to as "PEDOT") doped with polystyrene sulfonate (hereinafter referred to as "PSS"), polyaniline, and the like. In addition, an insulating high molecular compound is efficient to planarize an anode, and polyimide (hereinafter referred to as "PI") is often used. Further, an inorganic compound is also used as a hole injecting material, which includes an extra-thin film of aluminum oxide (hereinafter referred to as "alumina") as well as a thin film of a metal such as gold or platinum.

As the hole transporting material, an aromatic amine-based compound (i.e., a compound having a bond of benzene ring-nitrogen) is most widely used. The materials that are widely used include 4,4'-bis(diphenylamino)-biphenyl (hereinafter referred to as "TAD"), derivatives thereof such as 4,4'-bis[N-(3-methylphenyl)-N-phenyl-amino]-biphenyl (hereinafter referred to as "TPD") or 4,4'-bis[N-(1-naphthyl)-N-phenyl-amino]-biphenyl (hereinafter referred to as "α-NPD"), and besides, star burst aromatic amine compounds such as 4,4',4"-tris(N,N-diphenyl-amino)-triphenylamine (hereinafter referred to as "TDATA") and 4,4',4"-tris[N-(3-methylphenyl)-N-phenyl-amino]-triphenylamine (hereinafter referred to as "MTDATA").

As the electron transporting material, a metal complex is often used. A metal complex having a quinoline skeleton or a benzoquinoline skeleton, or the like can be used: tris(8-quinolinolato)aluminum (abbreviation: $Alq_3$), BAlq, tris(4-methyl-8-quinolinolato)aluminum (abbreviation: Almq), bis(10-hydroxybenzo[h]-quinolinato)beryllium (abbreviation: Bebq), and the like. Besides those, the following metal complex having an oxazole-based ligand or a thiazole-based ligand, or the like can be used: bis[2-(2-hydroxyphenyl)benzoxazolato]zinc (abbreviation: $Zn(BOX)_2$); bis[2-(2-hydroxyphenyl)benzothiazolato]zinc (abbreviation: $Zn(BTZ)_2$); and the like. Further, other than the metal complexes, oxadiazole derivatives such as 2-(4-biphenylyl)-5-(4-tert-butylphenyl)-1,3,4-oxadiazole (hereinafter referred to as "PBD") and OXD-7, triazole derivatives such as TAZ and 3-(4-tert-butylphenel)-4-(4-ethylphenyl)-5-(4-biphenylyl)-1,2,4-triazole (hereinafter referred to as "p-EtTAZ"), and phenanthroline derivatives such as bathophenanthroline (hereinafter referred to as "BPhen") and BCP have an electron transporting property.

As the electron injecting material, the above-described electron transporting materials can be used. In addition, an ultrathin film of an insulator, such as metal halide like calcium fluoride, lithium fluoride, or cesium fluoride, or alkali-metal oxide like lithium oxide, is often used. Further, an alkali-metal complex such as lithium acetyl acetonate (hereinafter referred to as "Li(acac)") or 8-quinolinolato-lithium (hereinafter referred to as "Liq") is also efficient to inject a electron to a light-emitting material.

As the light-emitting material, other than the above-described metal complexes such as $Alq_3$, Almq, BeBq, BAlq, $Zn(BOX)_2$, and $Zn(BTZ)_2$, various fluorescent pigments are efficient. The fluorescent pigments include 4,4'-bis(2,2-diphenyl-vinyl)-biphenyl which is produced in blue, 4-(dicyanomethylene)-2-methyl-6-(p-dimethylaminostyryl)-4H-pyran which is produced in red-orange, and the like. Also, a triplet light-emitting material can be used as the light-emitting material, which is mainly a complex with platinum or iridium as a central metal. As the triplet light-emitting material, tris(2-phenylpyridine)iridium, bis(2-(4'-tolyl)pyridinato-N,$C^{2'}$)acetylacetonatoiridium (hereinafter referred to as "$acacIr(tpy)_2$"), 2,3,7,8,12,13,17,18-octaethyl-21H,23Hporphyrin-platinum, and the like are known.

By combining the above-described materials that have respective functions, a light-emitting element with high reliability can be manufactured.

In accordance with the present invention, a polarity of potential applied to gates of an n-channel transistor and a p-channel transistor for driving an EL element can be reversed and input thereto without influence on display, as described in Embodiment Mode 1. In the display device provided with the EL element as a current drive element described in this embodiment mode, control of the transistors for supplying current to the EL element is needed; thus, the present invention is particularly preferable for driving an EL element. Even in the period during which light is emitted continuously for a certain period, the EL element can be driven without decrease in luminance and appearance of flicker of the still image. This is because the threshold voltage of a driving transistor can be controlled by reversing the polarity of potential applied to the gate of the driving transistor and inputting its reversed potential thereto.

Note that the contents described in each drawing in this embodiment mode can be optionally combined with or replaced with the contents described in another embodiment mode as appropriate.

Embodiment Mode 4

Figure 9A:
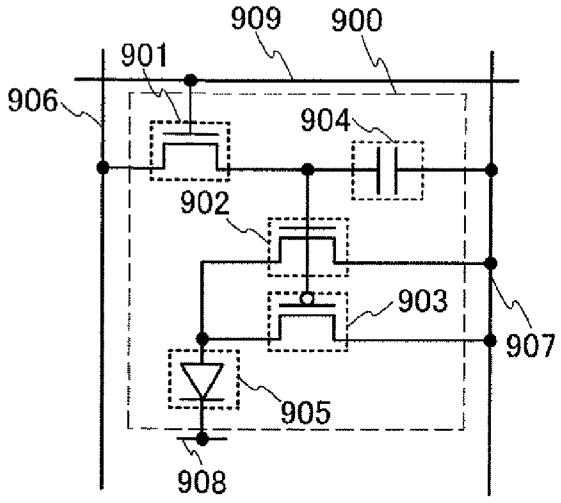
FIG. 9A is a diagram describing a pixel circuit according to an aspect of the present invention.
Figure 9B:
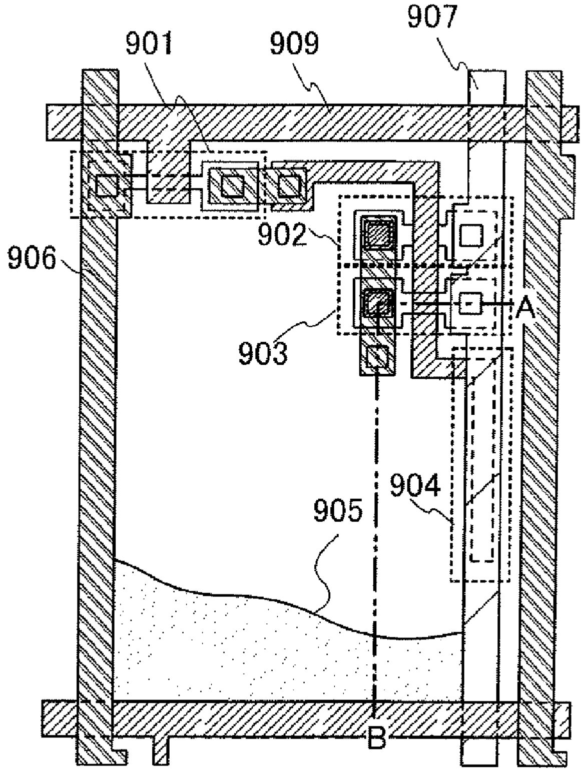
FIG. 9B is a top view thereof.
Figure 9C:
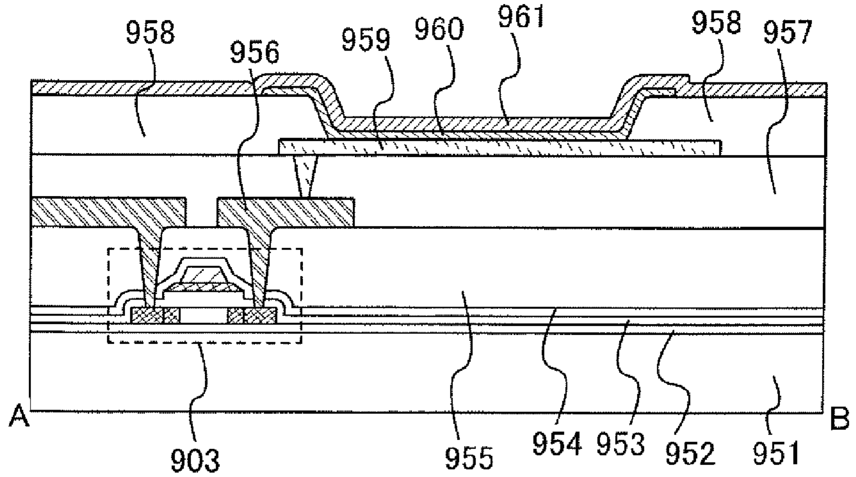
FIG. 9C is a cross-sectional view thereof.

In this embodiment mode, a circuit diagram of a pixel in a display device provided with a light-emitting element is shown in FIG. 9A, a top view structure of the pixel is shown in FIG. 9B, and a cross-sectional view of the top view structure of FIG. 9B is shown in FIG. 9C. Note that a configuration of a pixel in a display device of the present invention shown in this embodiment mode is just an example, and the present invention is not limited thereto.

In FIGS. 9A and 9B, a pixel 900 includes a switching transistor 901, an n-channel transistor 902, a p-channel transistor 903, a capacitor element 904, and a light-emitting element 905. A first terminal of the switching transistor 901 is electrically connected to a data line 906, a gate terminal thereof is electrically connected to a scanning line 909, and a second terminal thereof is electrically connected to a gate terminal of the n-channel transistor 902, a gate terminal of the p-channel transistor 903, and one of electrodes of the capacitor element 904. A first terminal of the n-channel transistor 902, a first terminal of the p-channel transistor 903, and the other electrode of the capacitor element 904 are electrically connected to a power supply line 907. A second terminal of the n-channel transistor 902 and the second terminal of the p-channel transistor 903 are electrically connected to one of electrodes of the light-emitting element 905. The other electrode of the light-emitting element 905 is connected to a ground line 908.

Although each of the switching transistor 901, the n-channel transistor 902, and the p-channel transistor 903 employs a structure having one gate in this embodiment mode, each of them may have a structure in which a plurality of gates are provided and a plurality of transistors are electrically connected in series. There is an advantage in that an off-current value can be reduced with the structure in which a plurality of transistors are electrically connected in series. Further, the switching transistor 901, the n-channel transistor 902, and the p-channel transistor 903 are each formed with a thin film transistor (TFT) in which a semiconductor layer is reduced in thickness, whereby mass production is achieved and reduction in cost can be realized.

Note that the n-channel transistor 902 and the p-channel transistor 903 are elements for controlling lighting of the light-emitting element 905 in which a large amount of current flows and are likely to be degraded due to heat or hot carriers.

As shown in FIG. 9B, a wiring including the gate of the n-channel transistor 902 and the gate of the p-channel transistor 903 extends to a region which is overlapped with the power supply line 907, and the capacitor element 904 is formed in the region. The capacitor element 904 is formed with a semiconductor layer (not shown) which is electrically connected to the power supply line 907, an insulating film (not shown) as the same layer as the gate insulating film, and the wiring including the gate of the n-channel transistor 902 and the gate of the p-channel transistor 903. This capacitor element 904 has a function of retaining voltage which is applied to the gate of the n-channel transistor 902 and the p-channel transistor 903.

The light-emitting element 905 has an element structure in which an anode layer (also referred to as a pixel electrode), an organic layer, and a cathode layer (also referred to as a counter electrode) are stacked over a substrate provided with elements such as the n-channel transistor 902 and the p-channel transistor 903.

In addition, in order to extract light emission of a light-emitting element, at least one of an anode and a cathode is required to be transparent. Field-effect transistors and a light-emitting element are formed over a substrate. As a light-emitting element, there are a light-emitting element having a top emission structure where light emission is extracted from a surface on which the field-effect transistors and the light-emitting element are formed, a light-emitting element having a bottom emission structure where light emission is extracted from a rear of the surface X and a light-emitting element having a dual emission structure where light emission is extracted from both the surfaces. A pixel structure of the present invention can be applied to any of light-emitting elements having light emission structure.

Next, a cross-sectional view corresponding to the top view of the pixel shown in FIG. 9B is described. FIG. 9C is an example of a cross-sectional view taken along a line A-B shown in FIG. 9B. Note that each element shown in the cross-sectional view in this embodiment mode is illustrated with an exaggerated scale in order to describe the cross-sectional structures definitely.

FIG. 9C is a cross-sectional view in which over a support substrate 951, the following are provided: a blocking film 952; an insulating layer 953; a protective layer 954; an insulating layer 955; a wiring layer 956; a planarization layer 957, a p-channel transistor 903; a bank 958; a pixel electrode 959, an organic layer 960; and a counter electrode 961. Note that the p-channel transistor 903 includes a gate insulating film, a semiconductor layer, and a gate electrode. The wiring layer 956 functions as a wiring which is connected to the first terminal and the second terminal of the p-channel transistor 903. Further, a light-emitting element 905 is formed by stacking the pixel electrode 959, the organic layer 960, and the counter electrode 961, the stacked structure functions.

As described in this embodiment mode, a thin film transistor can be used as a transistor for driving a display element. By employing the thin film transistor as the driving transistor, it is preferable to reduction in manufacturing cost because mass production can be facilitated. In addition, in accordance with the present invention, a polarity of potential applied to gate electrodes of an n-channel transistor and a p-channel transistor for driving an EL element can be reversed and input thereto without influence on display, as described in Embodiment Mode 1. Even in a period during which light is emitted continuously for a certain period, the EL element can be driven without decrease in luminance and appearance of flicker of the still image. This is because the threshold voltage of a driving transistor can be controlled by reversing the polarity of potential applied to the gate electrode of the driving transistor and applying the potential and its reversed potential alternately thereto.

Note that the contents described in each drawing in this embodiment mode can be optionally combined with or replaced with the contents described in another embodiment mode as appropriate.

Embodiment Mode 5

In this embodiment mode, examples of electronic devices will be described.

Figure 10A:
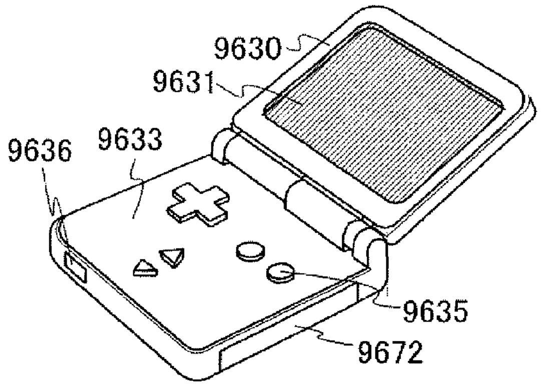
FIGS. 10A to 10E each illustrates an electronic device provided with a display device according to an aspect of the present invention.

FIG. 10A shows a portable game machine, which includes a housing 9630, a display portion 9631, a speaker 9633, operation keys 9635, a connection terminal 9636, a recording medium insert reading portion 9672, and the like. The portable game machine shown in FIG. 10A has a function of reading a program or data stored in the recording medium to display it on the display portion, a function of sharing information with another portable game machine by wireless communication, and the like. The portable game machine shown in FIG. 10A can have a variety of functions without being limited to the above.

Figure 10B:
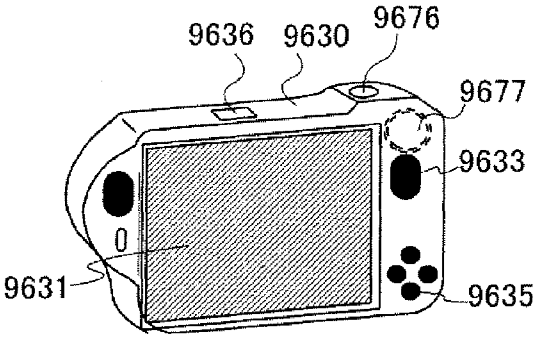

FIG. 10B shows a digital camera, which includes a housing 9630, a display portion 9631, a speaker 9633, operation keys 9635, a connection terminal 9636, a shutter button 9676, an imaging receiving portion 9677, and the like. The digital camera having the television reception function, which is shown in FIG. 10B, has a function of photographing a still image and a moving image; a function of automatically or manually correcting the photographed image; a function of obtaining a variety of information from an antenna; and a function of displaying the photographed image or the information obtained from the antenna on the display portion. Note that the digital camera having the television reception function shown in FIG. 10B can have a variety of functions without being limited to the above.

Figure 10C:
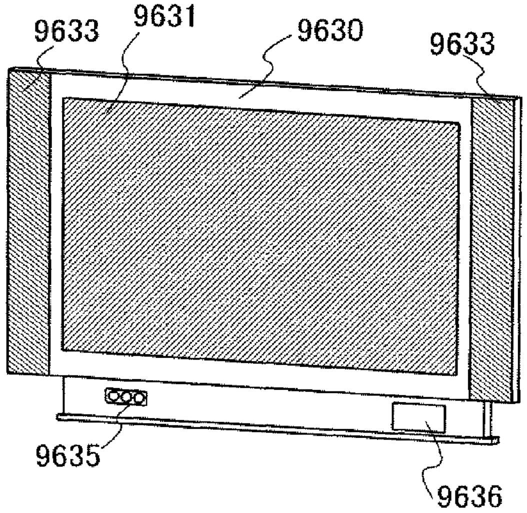

FIG. 10C shows a television set, which includes a housing 9630, a display portion 9631, speakers 9633, an operation key 9635, a connection terminal 9636, and the like. The television set shown in FIG. 10C has a function of processing an electric wave for television and converting the electric wave into a pixel signal, a function of processing the pixel signal and converting the pixel signal into a signal suitable for display, a function of converting a frame frequency of the pixel signal, and the like. Note that the television set shown in FIG. 10C can have a variety of functions without being limited to the above.

Figure 10D:
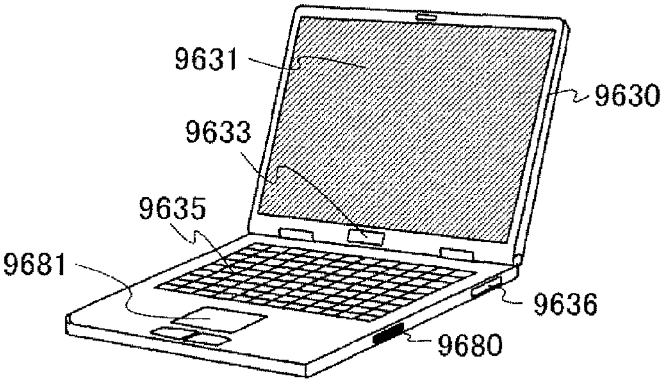

FIG. 10D shows a computer, which includes a housing 9630, a display portion 9631, a speaker 9633, operation keys 9635, a connection terminal 9636, a pointing device 9681, and an external connection port 9680, and the like. The computer shown in FIG. 10D has a function of displaying a variety of information (e.g., a still image, a moving image, and a text image) on the display portion; a function of controlling processing by a variety of software (programs); a communication function such as wireless communication or wire communication; a function of connecting to various computer networks by using the communication function; a function of transmitting or receiving a variety of data by using the communication function; and the like. Note that the computer shown in FIG. 10D can have a variety of functions without being limited to the above.

Figure 10E:
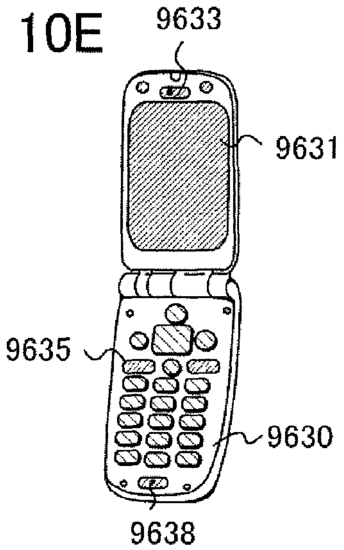

FIG. 10E shows a mobile phone, which includes a housing 9630, a display portion 9631, a speaker 9633, operation keys 9635, a microphone 9638, an external connecting port 9680, and the like. The mobile phone shown in FIG. 10E has a function of displaying a variety of information (e.g., a still image, a moving image, and a text image) on the display portion; a function of displaying a calendar, a date, the time, and the like on the display portion; a function of operating or editing the information displaying on the display portion; a function of controlling processing by various kinds of software (programs); and the like. Note that the mobile phone shown in FIG. 10E can have a variety of functions without being limited to the above.

The electronic devices described in this embodiment mode have a feature that they have a display device of the present invention in a display portion for displaying information. In accordance with the present invention, a polarity of potential applied to gate electrodes of an n-channel transistor and a p-channel transistor for driving an EL element can be reversed and input thereto without influence on display, as described in Embodiment Mode 1. Even in a period during which light is emitted continuously for a certain period, the EL element can be driven without decrease in luminance and appearance of flicker of the still image. This is because the threshold voltage of a driving transistor can be controlled by reversing the polarity of potential applied to the gate electrode of the driving transistor and input the potential and its reversed potential alternately thereto.

Note that the contents described in each drawing in this embodiment mode can be freely combined with or replaced with the contents described in another embodiment mode as appropriate.

This application is based on Japanese Patent Application serial no. 2007-336322 filed with Japan Patent Office on Dec. 27, 2007, the entire contents of which are hereby incorporated by reference.

What is claimed is:

1. A display device comprising:

an n-channel transistor including a first terminal and a second terminal, wherein the first terminal of the n-channel transistor is electrically connected to a power supply line and the second terminal of the n-channel transistor is electrically connected to a light-emitting element;

a p-channel transistor including a first terminal and a second terminal, wherein the first terminal of the p-channel transistor is electrically connected to the power supply line and the second terminal of the p-channel transistor is electrically connected to the light-emitting element; and a switching element including a first terminal and a second terminal, wherein the first terminal of the switching element is electrically connected to a data line and the second terminal of the switching element is electrically connected to a gate electrode of the n-channel transistor and a gate electrode of the p-channel transistor.

2. A display device comprising:

an n-channel transistor including a first terminal and a second terminal, wherein the first terminal of the n-channel transistor is electrically connected to a power supply line and the second terminal of the n-channel transistor is electrically connected to a light-emitting element;

a p-channel transistor including a first terminal and a second terminal, wherein the first terminal of the p-channel transistor is electrically connected to the power supply line and the second terminal of the p-channel transistor is electrically connected to the light-emitting element;

a capacitor element including a first terminal and a second terminal, wherein the first terminal of the capacitor element is electrically connected to a gate electrode of the n-channel transistor and a gate electrode of the p-channel transistor and the second terminal of the capacitor element is electrically connected to the power supply line; and a switching element including a first terminal and a second terminal, wherein the first terminal of the switching element is electrically connected to a data line and the second terminal of the switching element is electrically connected to the gate electrode of the n-channel transistor and the gate electrode of the p-channel transistor.

3. A display device comprising:

an n-channel transistor including a first terminal and a second terminal, wherein the first terminal of the n-channel transistor is electrically connected to a first power supply line and the second terminal of the n-channel transistor is electrically connected to a light-emitting element;

a p-channel transistor including a first terminal and a second terminal, wherein the first terminal of the p-channel transistor is electrically connected to the first power supply line and the second terminal of the p-channel transistor is electrically connected to the light-emitting element;

a first switching element including a first terminal and a second terminal, wherein the first terminal of the first switching element is electrically connected to a data line and the second terminal of the first switching element is electrically connected to a gate electrode of the n-channel transistor and a gate electrode of the p-channel transistor; and a second switching element including a first terminal and a second terminal, wherein the first terminal of the second switching element is electrically connected to a second power supply line and the second terminal of the second switching element is electrically connected to the gate electrode of the n-channel transistor and the gate electrode of the p-channel transistor.

4. A display device comprising:

an n-channel transistor including a first terminal and a second terminal, wherein the first terminal of the n-channel transistor is electrically connected to a first power supply line and the second terminal of the n-channel transistor is electrically connected to a light-emitting element;

a p-channel transistor including a first terminal and a second terminal, wherein the first terminal of the p-channel transistor is electrically connected to the first power supply line and the second terminal of the p-channel transistor is electrically connected to the light-emitting element;

a capacitor element including a first terminal and a second terminal, wherein the first terminal of the capacitor element is electrically connected to a gate electrode of the n-channel transistor and a gate electrode of the p-channel transistor and the second terminal of the capacitor element is electrically connected to the first power supply line;

a first switching element including a first terminal and a second terminal, wherein the first terminal of the first switching element is electrically connected to a data line and the second terminal of the first switching element is electrically connected to the gate electrode of the n-channel transistor and the gate electrode of the p-channel transistor; and a second switching element including a first terminal and a second terminal, wherein the first terminal of the second switching element is electrically connected to a second power supply line and the second terminal of the second switching element is electrically connected to the gate electrode of the n-channel transistor and the gate electrode of the p-channel transistor.

5. The display device according to claims 1 or 2, wherein the switching element is a thin film transistor.

6. The display device according to claims 3 or 4, wherein the second switching element is a thin film transistor.

7. The display device according to any one of claims 1 to 4, wherein the light-emitting element includes a first electrode, a second electrode, and a light-emitting layer interposed between the first electrode and the second electrode.

8. The display device according to any one of claims 1 to 4, wherein the n-channel transistor and the p-channel transistor are enhancement-type transistors.

9. The display device according to any one of claims 1 to 4, wherein the n-channel transistor and the p-channel transistor are configured to be independently turned on and off alternately while the light-emitting element is emitting light.

10. The display device according to any one of claims 1 to 4, wherein the gate electrode of the n-channel transistor and the gate electrode of the p-channel transistor are configured to be supplied with a positive potential and a negative potential alternately while the light-emitting element is emitting light.

11. An electronic device having the display device according to any one of claims 1 to 4, wherein the electronic device is one selected from a portable game machine, a digital camera, a television set, a computer and a mobile phone.

* * * * *